(12) United States Patent
Baker

(10) Patent No.: US 7,306,468 B2
(45) Date of Patent: *Dec. 11, 2007

(54) COAXIAL MODULE WITH SURGE PROTECTOR

(75) Inventor: Scott K. Baker, Richfield, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/055,241

(22) Filed: Feb. 8, 2005

(65) Prior Publication Data

US 2005/0146828 A1    Jul. 7, 2005

Related U.S. Application Data

(63) Continuation of application No. 10/377,305, filed on Feb. 28, 2003, now Pat. No. 6,881,076.

(51) Int. Cl.
    *H01R 12/00*      (2006.01)

(52) U.S. Cl. .................. 439/76.1; 439/675; 439/620.08

(58) Field of Classification Search ................ 439/620, 439/76.1, 668, 188, 669, 675, 715, 55, 6, 439/620.01, 620.08, 620.03, 620.21; 333/260, 333/245, 247; 174/50, 50.52, 50.58, 59; 361/111, 119, 799, 118, 124
See application file for complete search history.

(56) References Cited

U.S. PATENT DOCUMENTS

| | | |
|---|---|---|
| 3,274,447 A | 9/1966 | Nelson |
| 3,659,153 A | 4/1972 | Neuber |
| 3,711,794 A | 1/1973 | Tasca et al. |
| 5,053,910 A * | 10/1991 | Goldstein .................. 361/111 |
| 5,155,649 A | 10/1992 | Hung et al. |
| 5,175,662 A * | 12/1992 | DeBalko et al. ............ 361/119 |
| 5,209,678 A | 5/1993 | Allen et al. |
| 5,413,494 A | 5/1995 | Dewey et al. |
| 5,508,873 A | 4/1996 | Knapp et al. |
| 5,938,478 A * | 8/1999 | Werner ....................... 439/668 |

(Continued)

FOREIGN PATENT DOCUMENTS

DE     299 09 411 U1    10/2000

(Continued)

OTHER PUBLICATIONS

Exhibit A, Telect, Connecting the Future, printout of website page regarding Certeza Slim Rack DID-0000-6400, 3 pages, dated Mar. 8, 2001.

(Continued)

*Primary Examiner*—P. Austin Bradley
*Assistant Examiner*—Edwin A. Leon
(74) *Attorney, Agent, or Firm*—Merchant & Gould P.C.

(57) ABSTRACT

A coaxial module includes a conductive housing, front and rear coaxial connectors, and circuitry disposed within the housing including a removable surge protector device. The circuitry within the housing includes a circuit board, including a cutout. Disposed within the cutout is the surge protector device. The surge protector device includes pins for mounting to an edge mount of the circuit board, and the housing includes a removable cover to allow access to the cutout and the surge protector device.

8 Claims, 20 Drawing Sheets

U.S. PATENT DOCUMENTS

| | | | |
|---|---|---|---|
| 6,116,961 A | | 9/2000 | Henneberger et al. |
| 6,322,375 B1 * | | 11/2001 | Cole et al. ............... 439/76.1 |
| 6,411,487 B1 * | | 6/2002 | Rawlings et al. ........... 361/124 |
| 6,450,836 B1 | | 9/2002 | Youtsey |
| 6,454,584 B1 | | 9/2002 | Milan |
| 6,785,110 B2 | | 8/2004 | Bartel et al. |

FOREIGN PATENT DOCUMENTS

| | | |
|---|---|---|
| EP | 10 059 703 A1 | 12/2000 |
| WO | WO 96/37929 | 11/1996 |
| WO | WO 02/076111 | 9/2002 |

OTHER PUBLICATIONS

Exhibit B, ADC Telecommunications Product Catalog, "Digital Signal Cross-Connect (DSX-3) Front and Rear Cross-Connect Products," dated Feb. 1999.

Exhibit C, ADC Telecommunications Product Catalog, "DSX-1 Digital Signal Cross-Connect Super High Density Bays, High Density Bays Sixth Edition," dated May 1998.

Exhibit D, ADC Telecommunications Product Catalog, "PXPLUS™ DS1 Digital Signal Cross-Connect," dated Jan. 1997.

Exhibit E, ADC Telecommunications Product Catalog, "RZX-3 Rear Cross-Connect Products," dated Jul. 1998.

Exhibit F, Littelfuse literature entitled "Littelfuse 1021 medium duty arrester series," one page. (admitted as prior art as of filing date).

Exhibit G, Specifications and Product Descriptions from Communications Equipment International, 10 pages. (admitted as prior art as of filing date).

Exhibit H, Shinko Electric Industries CO., Ltd. brochure entitled "Surge Protective Device," 13 pages. (admitted as prior art as of filing date).

* cited by examiner

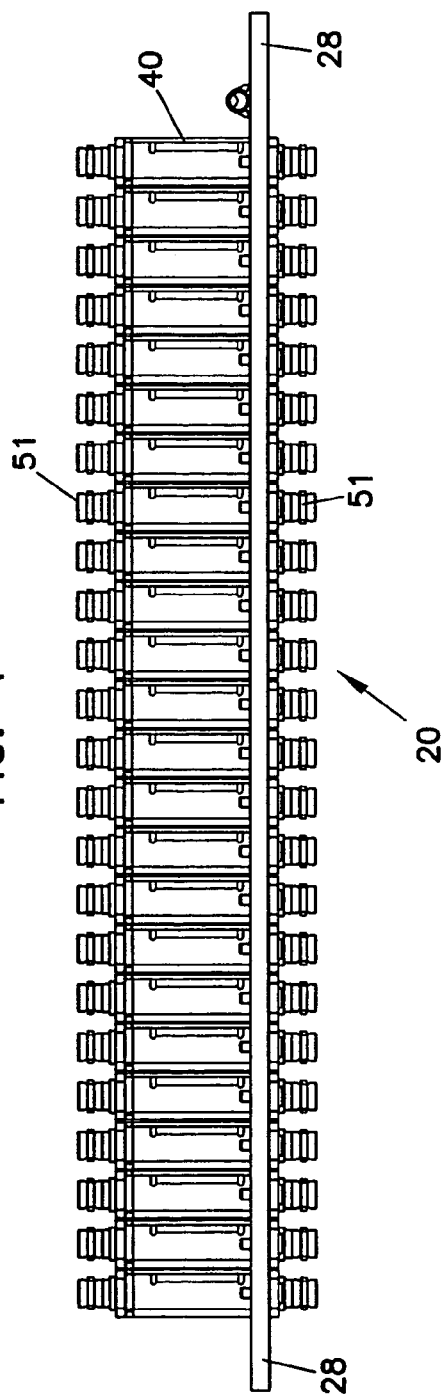
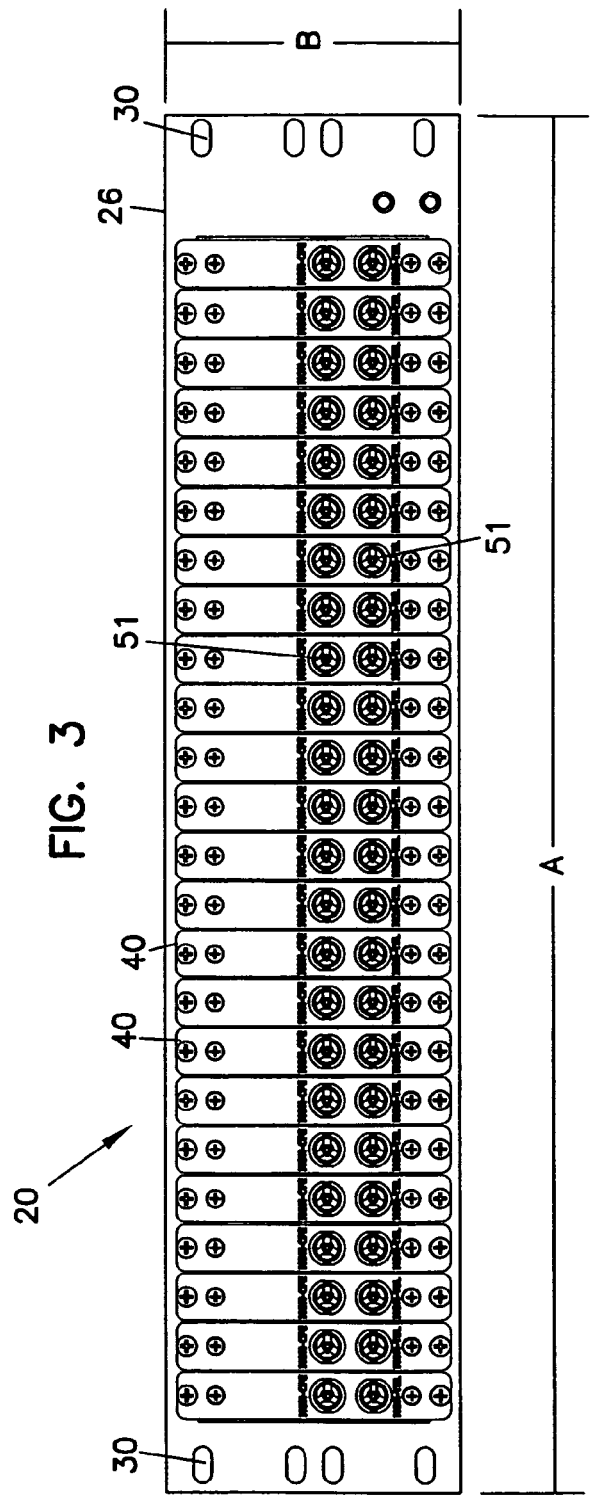
FIG. 4
FIG. 3

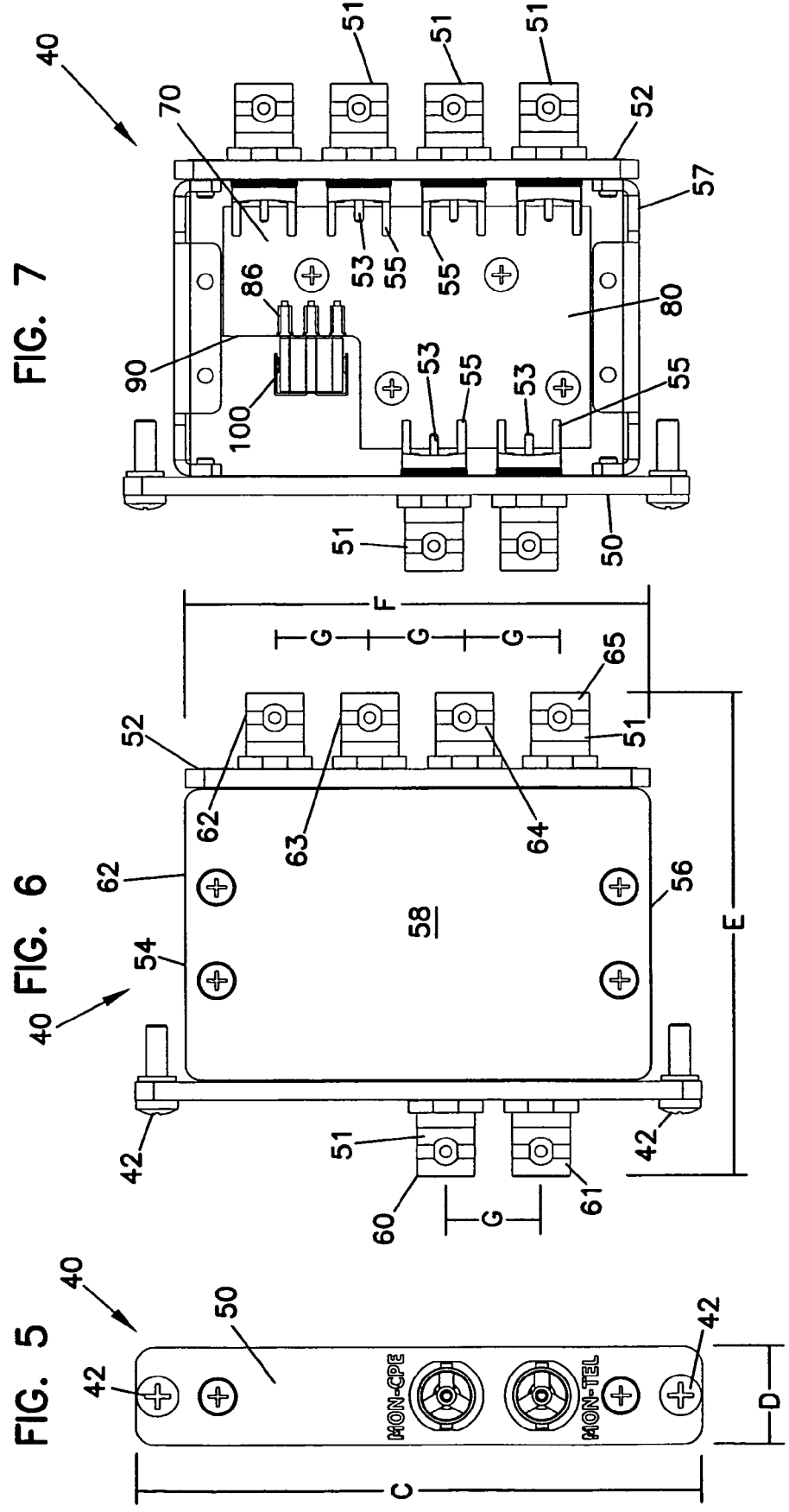

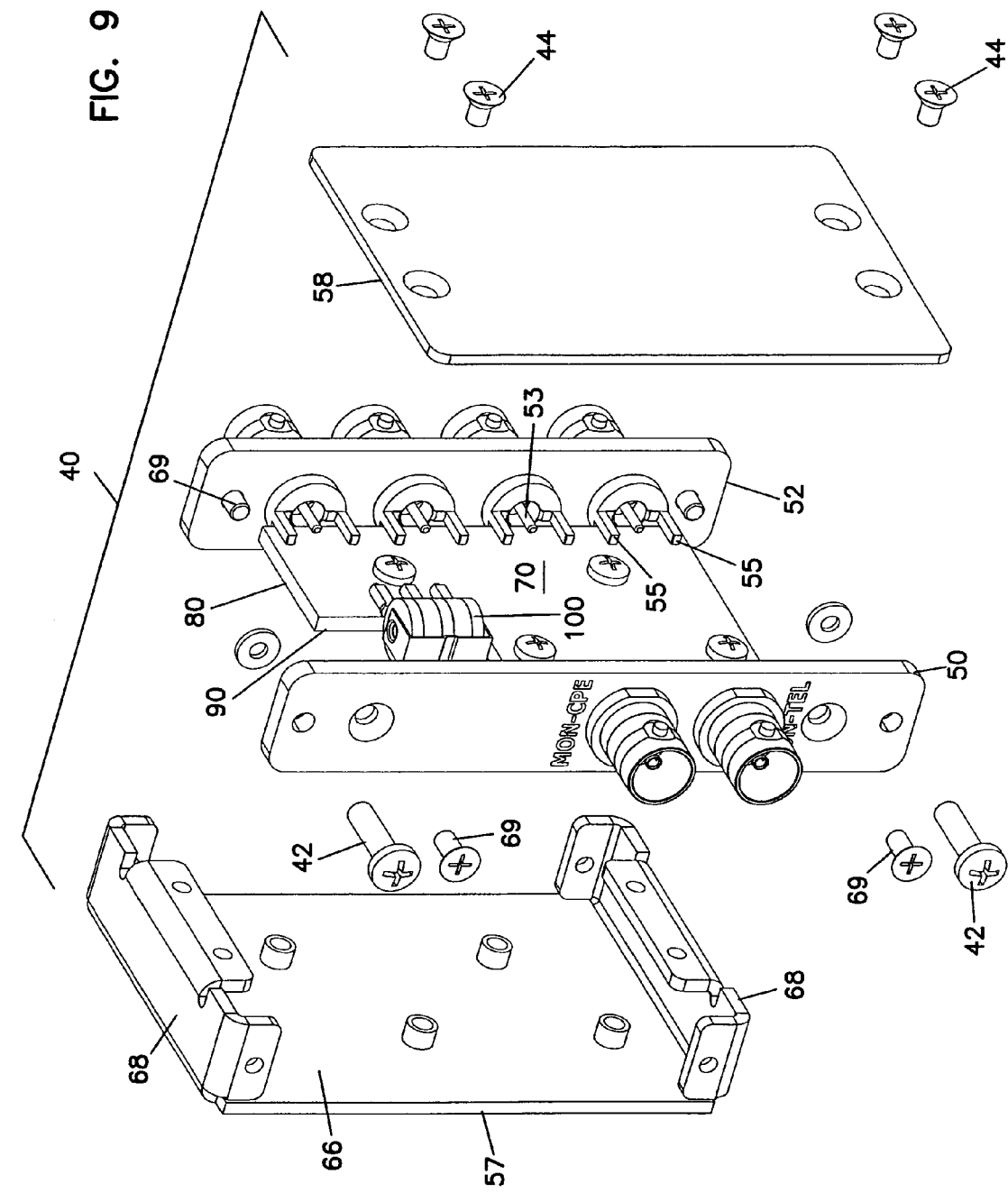

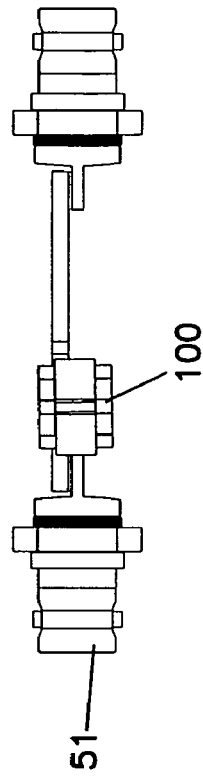
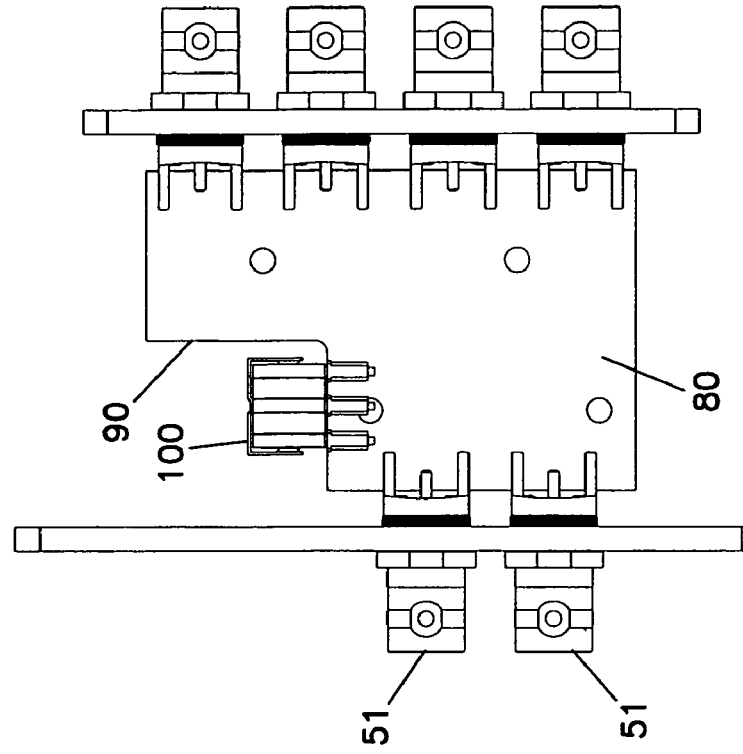
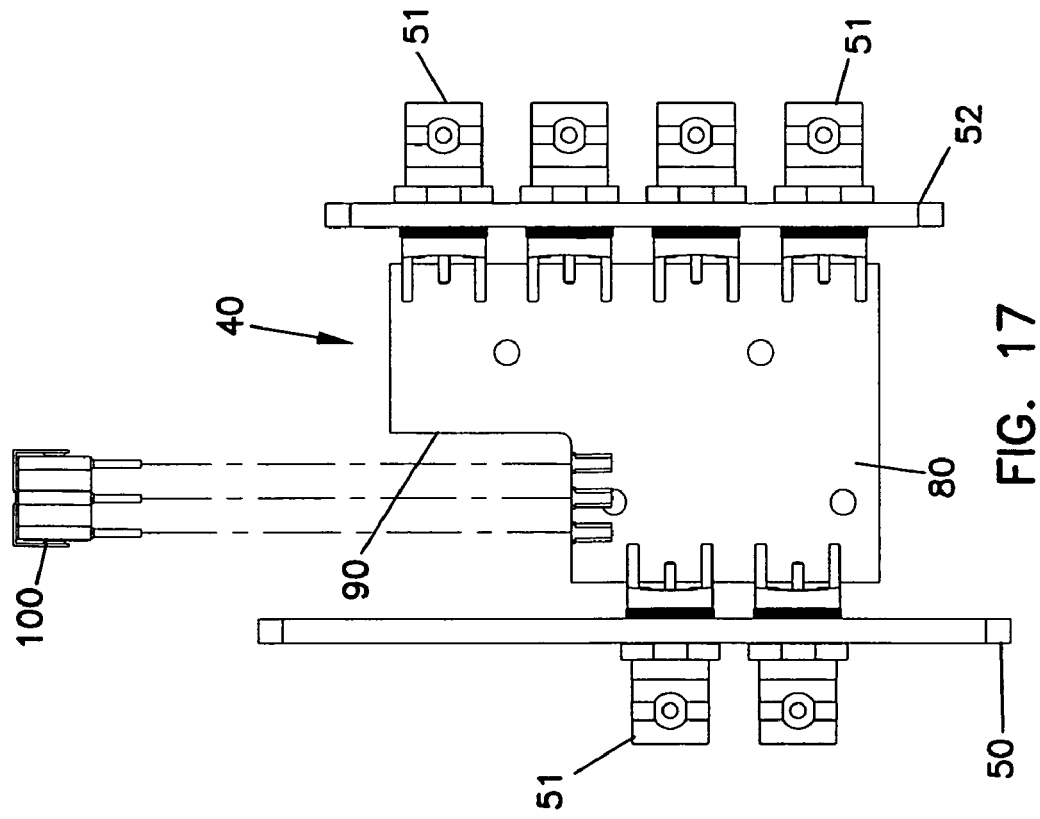

FIG. 19
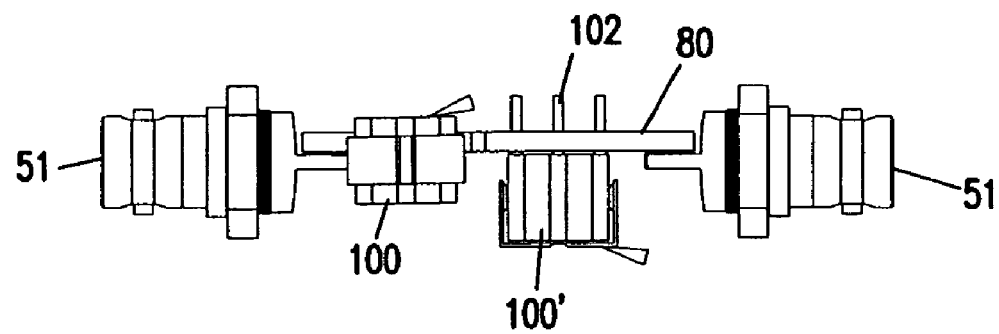
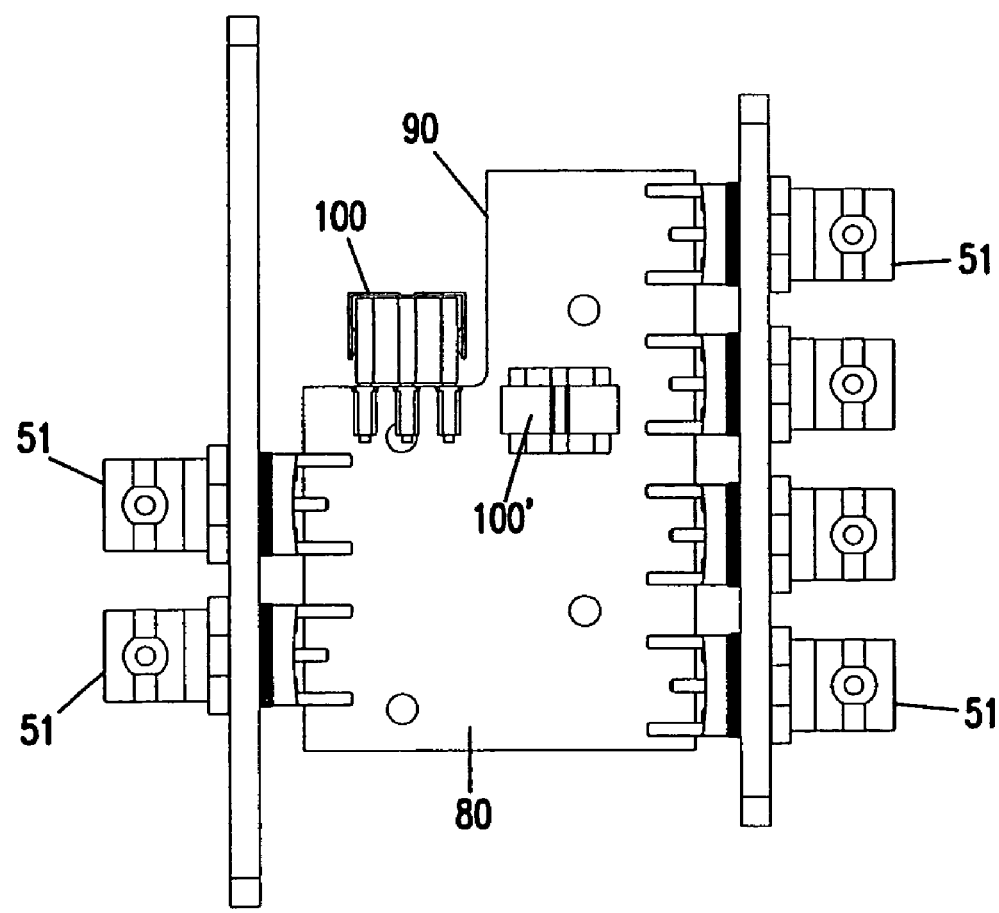
FIG. 18

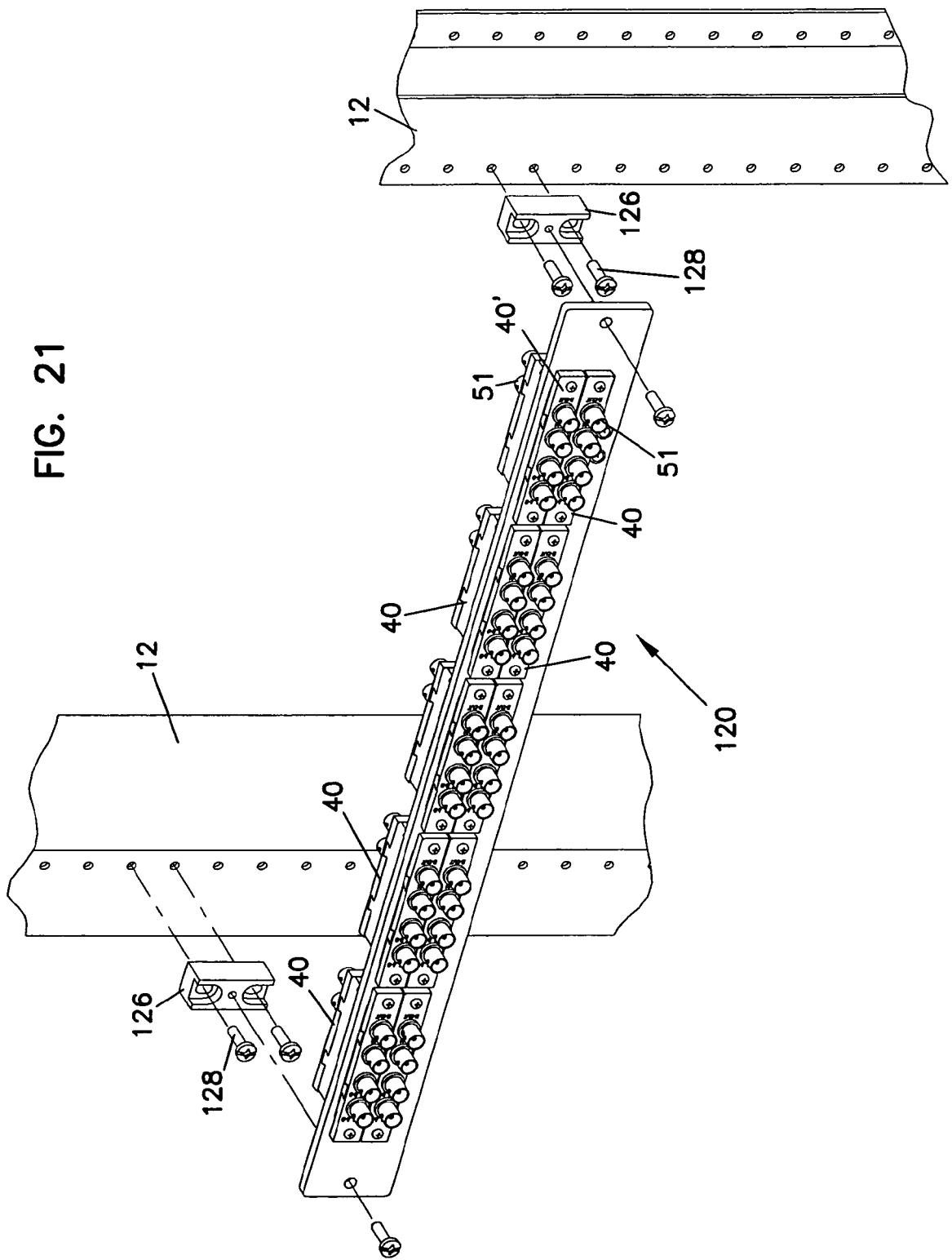

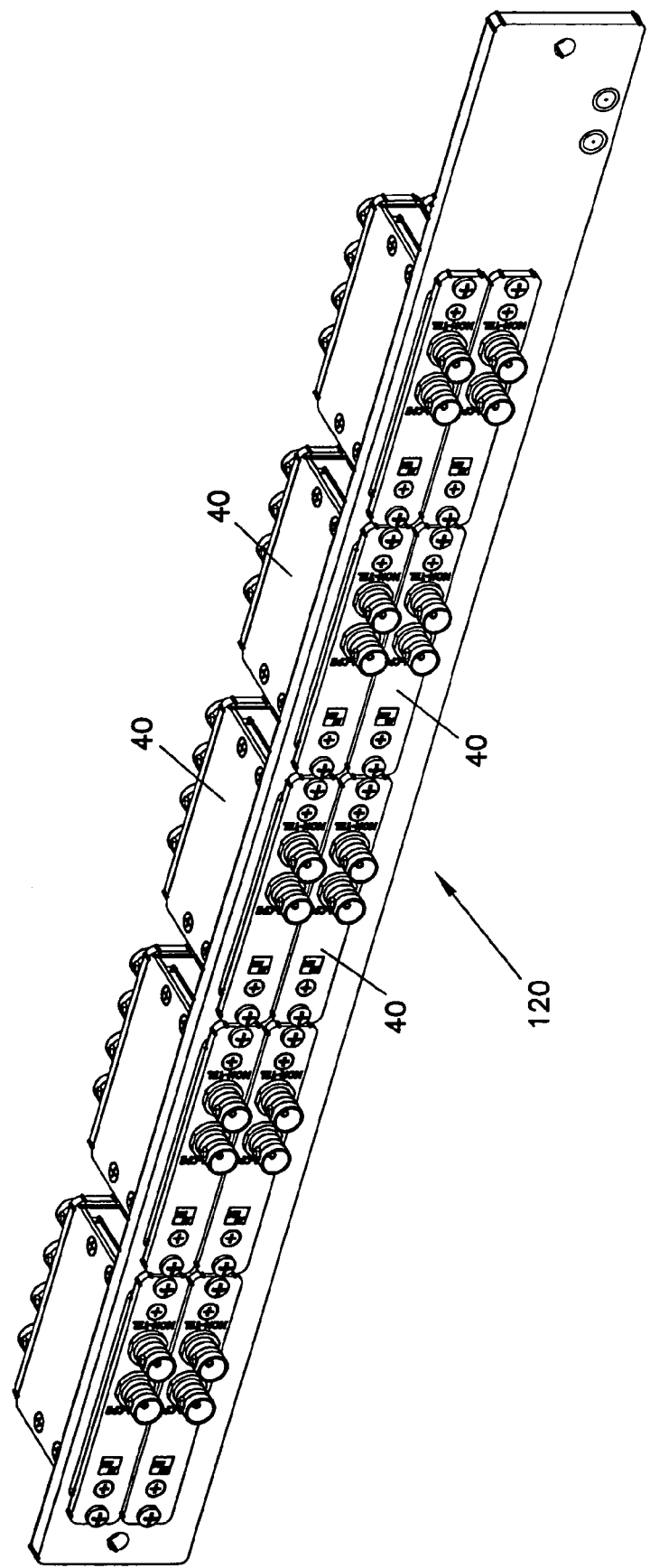

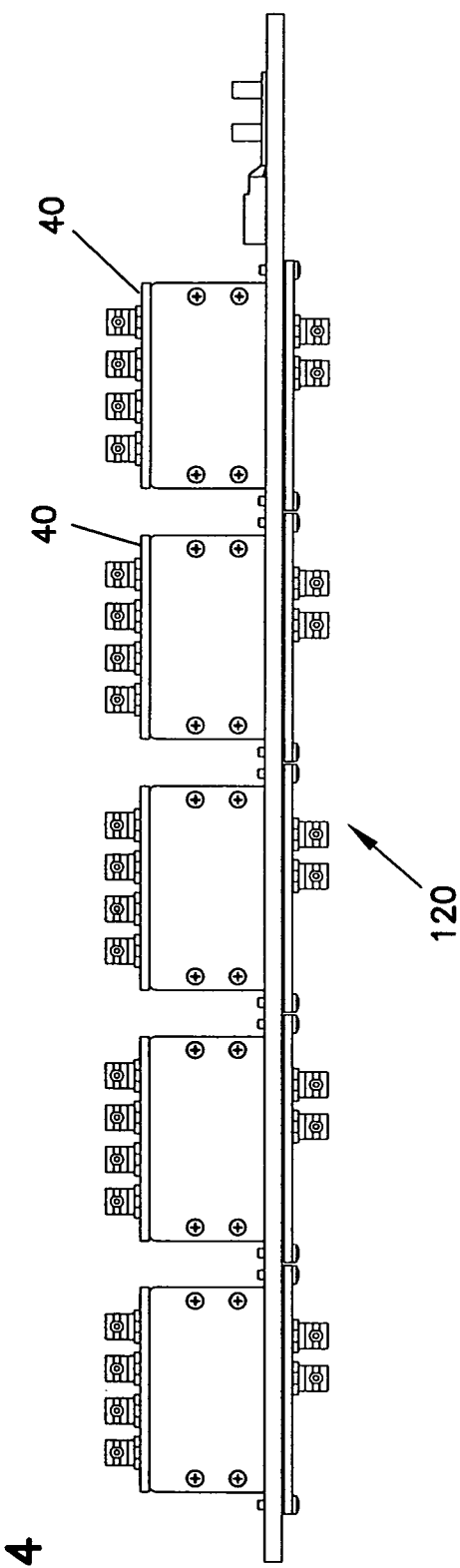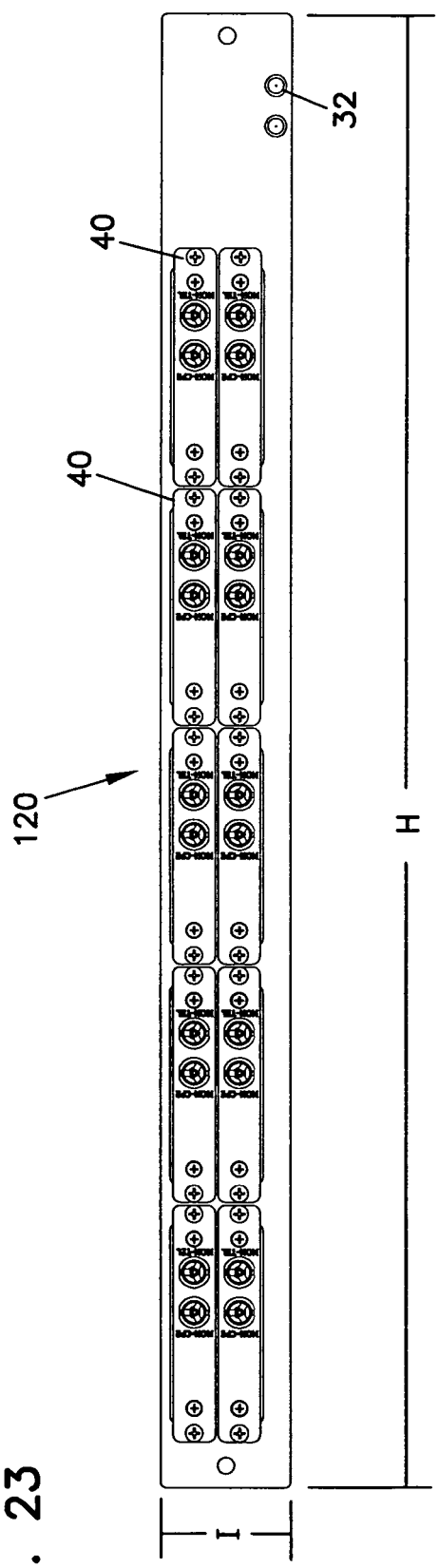
FIG. 24
FIG. 23

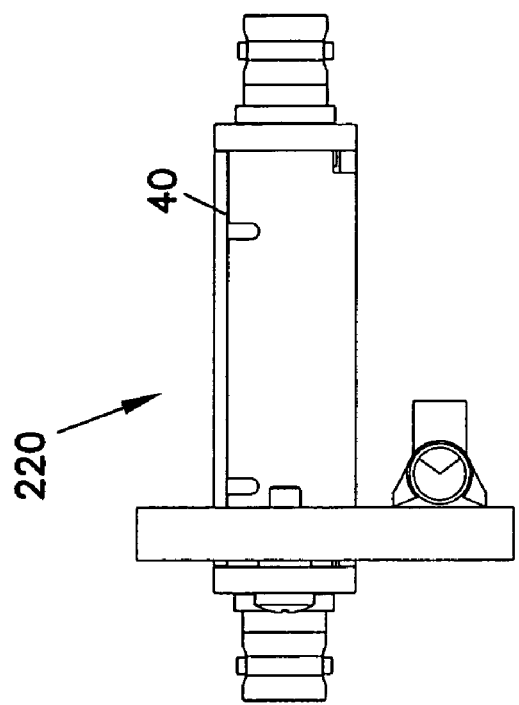
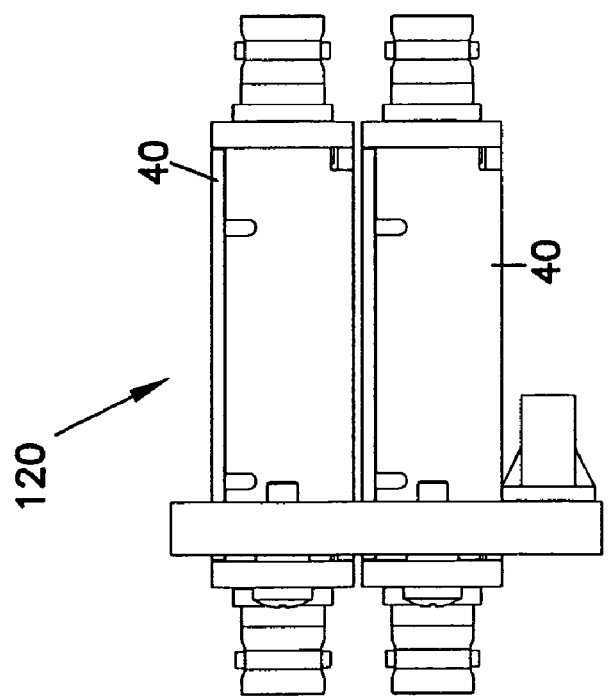

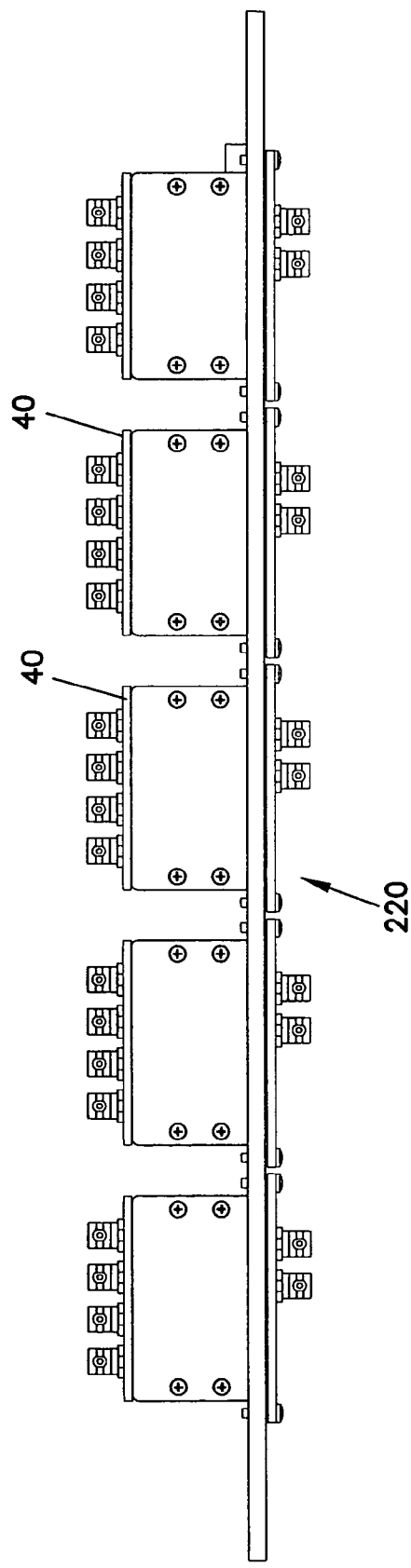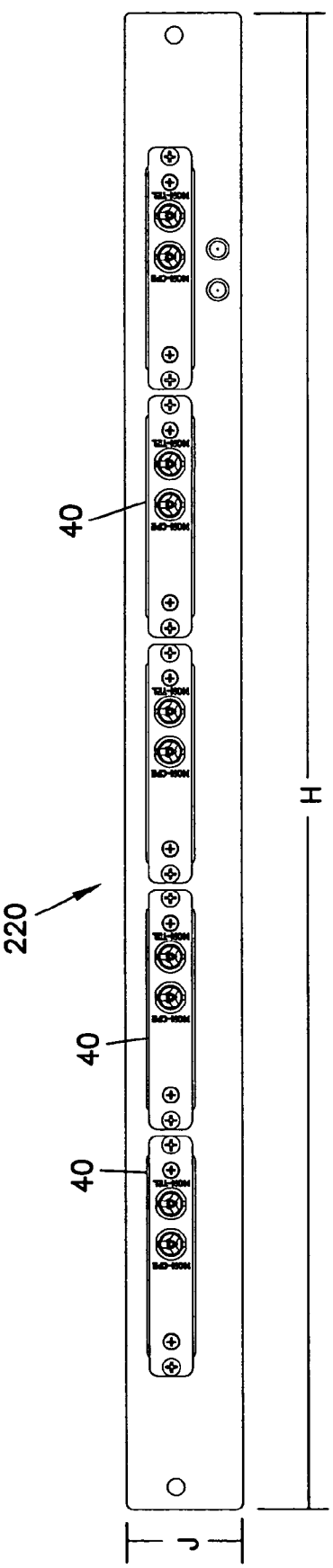

COAXIAL MODULE WITH SURGE PROTECTOR

This application is a continuation of application Ser. No. 10/377,305, filed Feb. 28, 2003 now U.S. Pat. No. 6,881,076, which application is incorporated herein by reference.

This invention relates to panels for coaxial cables. More particularly this invention relates to coaxial panels including surge protection.

BACKGROUND OF THE INVENTION

In the telecommunications industry, high frequency signals are commonly transmitted across coaxial cables. From time to time, such cables must be interconnected. For example, it is desirable to provide an interconnection point between two pieces of telecommunications equipment to provide a convenient location in a telecommunications system for accessing signals as well as monitoring signals from time to time. It is also convenient to aggregate these access locations in a single rack of equipment both for efficiency and to allow patch cables to quickly and easily route or reroute a communications signal between or around telecommunications equipment.

There is a need to protect the coaxial cables from lightning and power surges. Protecting the cables from power surges, while maintaining efficient use of space associated with the racks, is a concern.

SUMMARY OF THE INVENTION

One aspect of the present invention relates to a coaxial module including a replaceable surge protector device. Preferably, the module includes an electrically conductive housing including coaxial connectors. Disposed within an interior of the housing is a replaceable surge protector device. A portion of the housing is removable to allow access to the replaceable surge protector device.

In the preferred embodiment, the module includes a circuit board disposed within the housing. Preferably, the circuit board includes a cutout portion for receiving the replaceable surge protector device. In one preferred embodiment, the surge protector device includes three pins connectable to the circuit board along an edge of the circuit board.

The preferred modules of the present invention are mountable together in a panel. Preferably, the panel is mountable to a telecommunications rack.

BRIEF DESCRIPTION OF THE DRAWINGS

FIG. 3 is a front view of the panel of FIG. 2.

FIG. 4 is a top view of the panel of FIG. 2.

FIG. 5 is a front view of the coaxial module of the panel of FIG. 2.

FIG. 6 is a side view of the coaxial module of FIG. 5.

FIG. 7 is a side view of the coaxial module of FIG. 5, shown with the cover removed.

FIG. 9 is a further exploded perspective view of the coaxial module of FIG. 5.

FIG. 15 shows a module with an alternative circuit board to the circuit board of FIG. 10.

FIG. 16 is a top view of the module of FIG. 15.

FIG. 17 is a side view of the module of FIG. 15 showing the surge protector device removed from the mounting location.

FIG. 18 is a side view of a further alternative circuit board showing a surge protector device mounted in the cutout of the circuit board, as well as an alternative positioning with the pins of the surge protector device mounted through the circuit board.

FIG. 19 is a top view of the module of FIG. 18.

FIG. 21 is an exploded perspective view of a first alternative embodiment of a panel and a rack.

FIG. 22 is a perspective view of the panel shown in FIG. 21.

FIG. 23 is a front view of the panel of FIG. 22.

FIG. 24 is a top view of the panel of FIG. 22.

FIG. 25 is a side view of the panel of FIG. 22.

FIG. 28 is a front view of the panel of FIG. 27.

FIG. 29 is a top view of the panel of FIG. 27.

FIG. 30 is a side view of the panel of FIG. 27.

DETAILED DESCRIPTION

Figure 1:
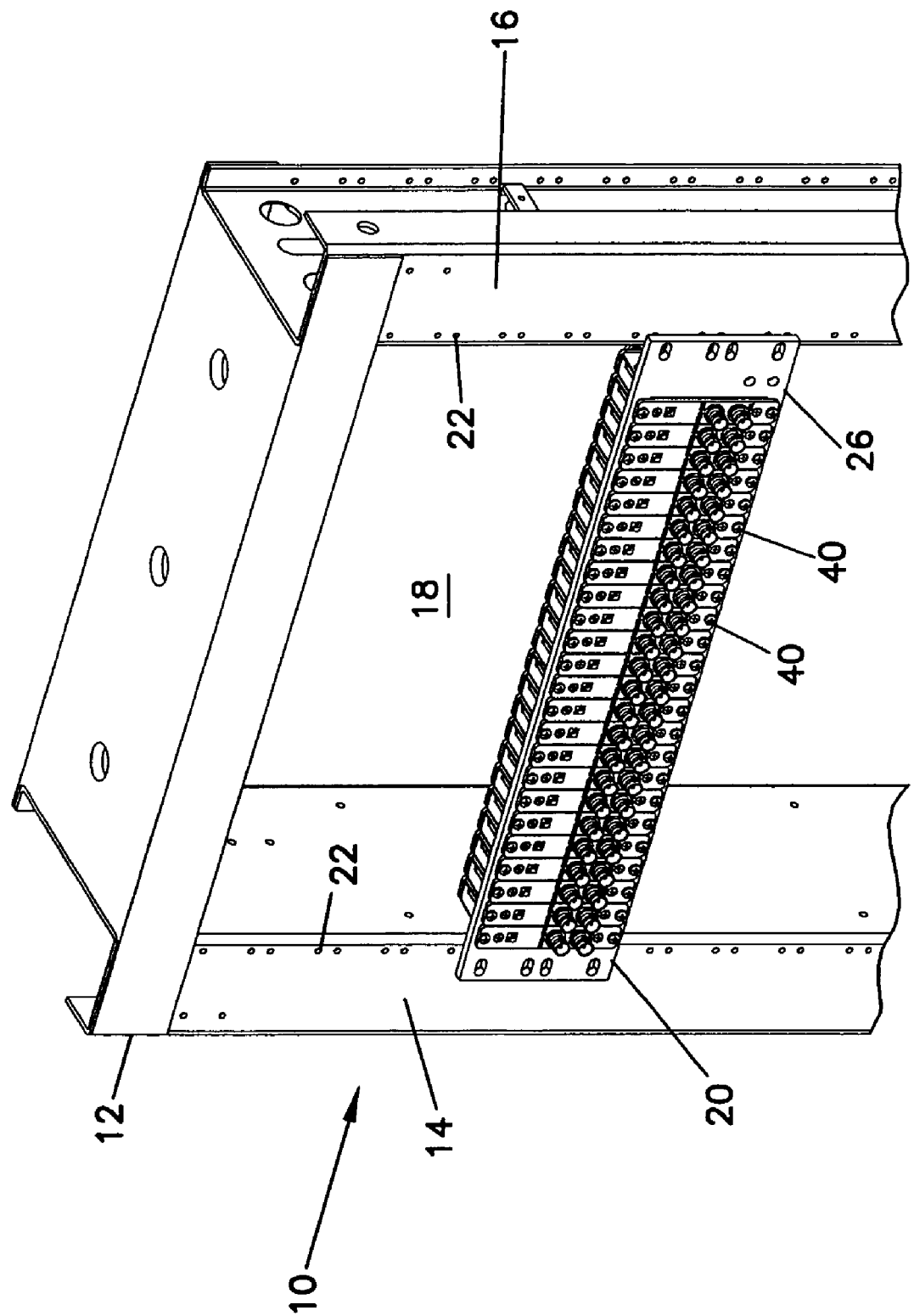
FIG. 1 is a perspective view of a rack and a coaxial panel according to the present invention.

Referring now to FIG. 1, an embodiment of a telecommunications system 10 is shown. System 10 includes a rack 12 with vertical uprights 14, 16. Disposed between uprights 14 and 16 is a receiving area 18 for receiving telecommunications panels 20, or other equipment. Rack 12 is preferably either a 19-inch or 23-inch wide rack, both of which are standards in the telecommunications industry. In FIG. 1, rack 12 is a 19-inch rack.

Panel 20 and other equipment mount to rack 12 with fasteners into fastener holes 22 in uprights 14, 16. Fastener holes 22 are spaced apart as desired. Preferably fastener holes 22 are spaced apart in accordance with either an EIA standard (for a rack unit spacing of 1.75 inches) or a WECO standard (for a rack unit spacing of 1 inch), both of which are standards in the telecommunications industry.

Figure 2:
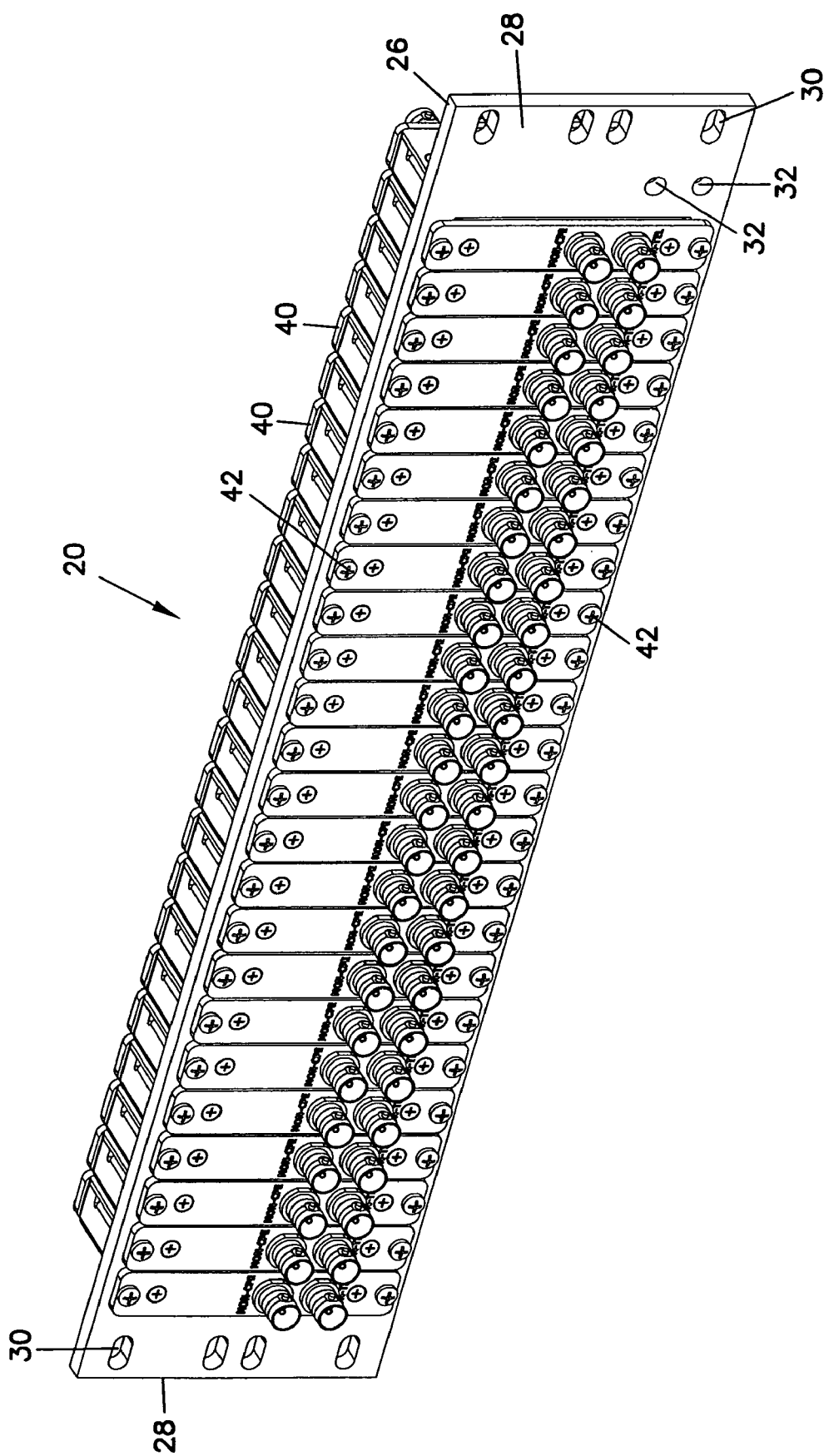
FIG. 2 is a perspective view of the panel of FIG. 1.
Figure 10:
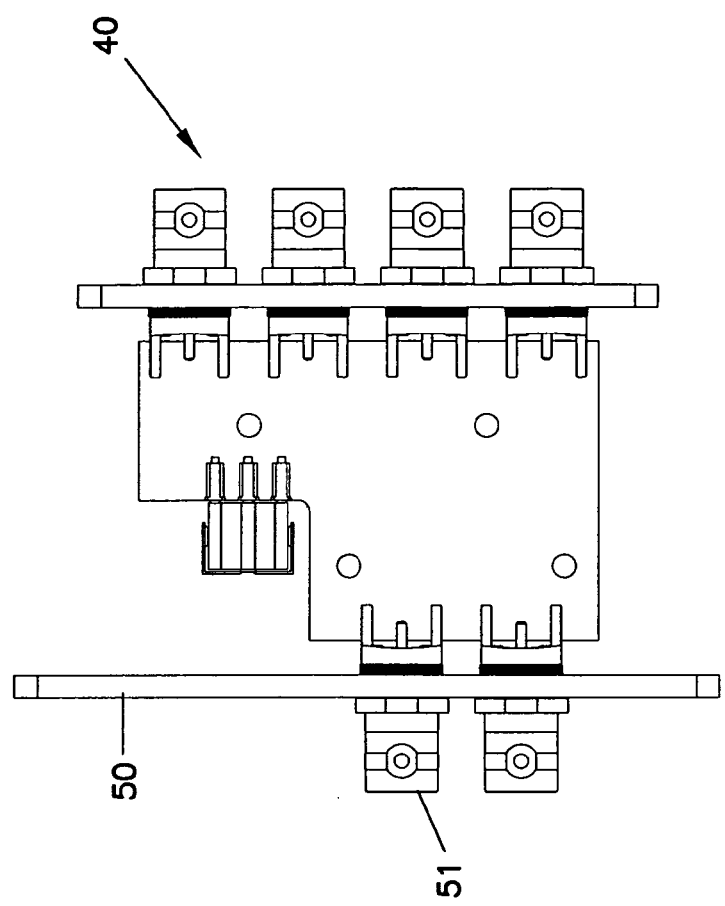
FIG. 10 is a side view of the coaxial module of FIG. 5, shown with the cover and the main housing portion removed.
Figure 12:
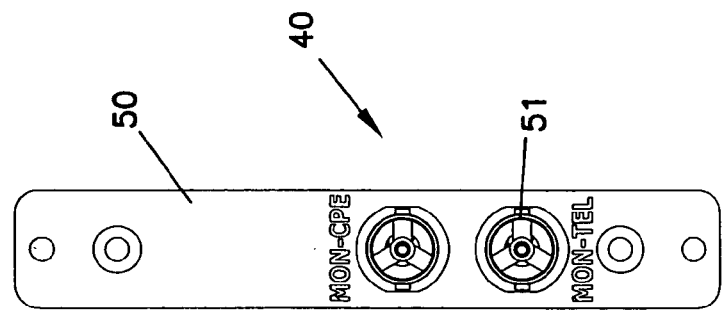
FIG. 12 is a front view of the coaxial module of FIG. 10.
Figure 14:
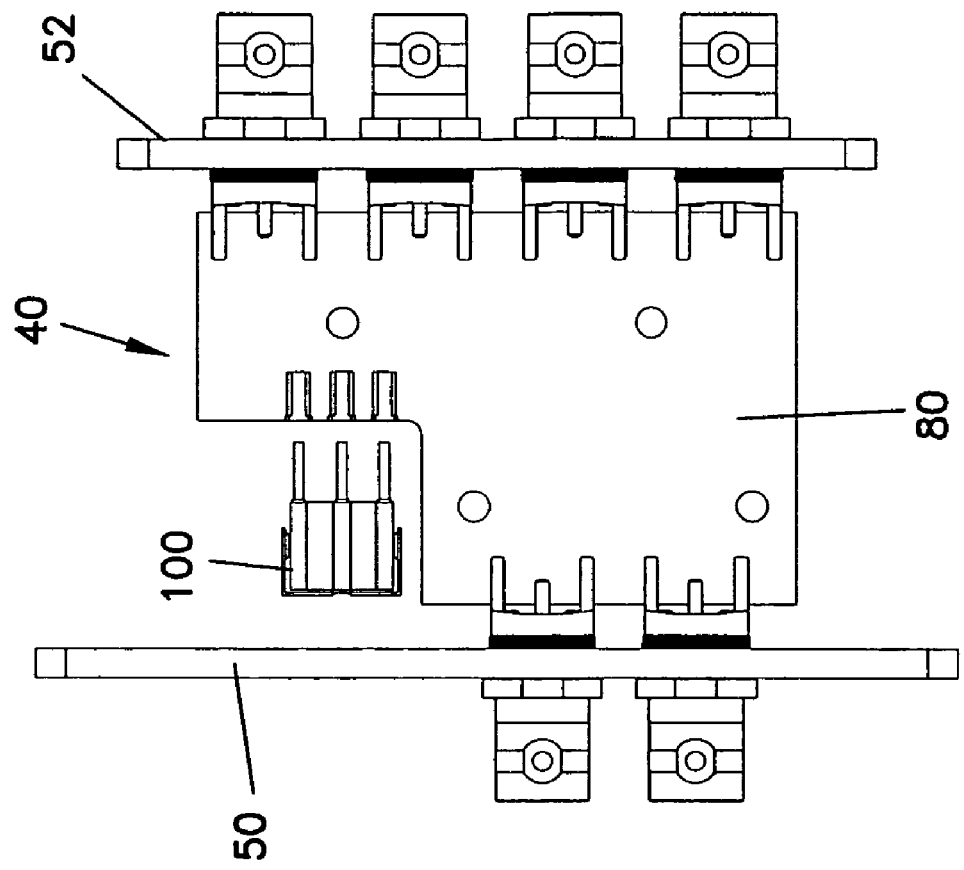
FIG. 14 is a side view of the coaxial module of FIG. 10, shown with the surge protector device removed from the mounting location.
Figure 13:
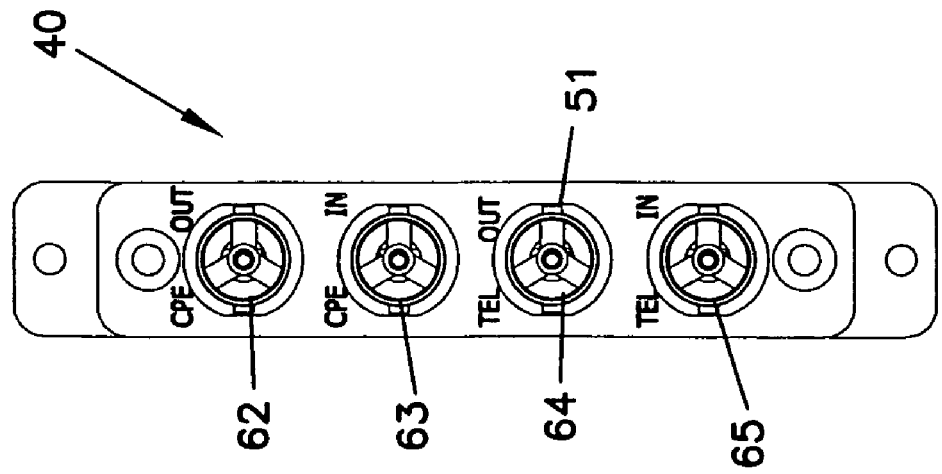
FIG. 13 is a back view of the coaxial module of FIG. 10.
Figure 20:
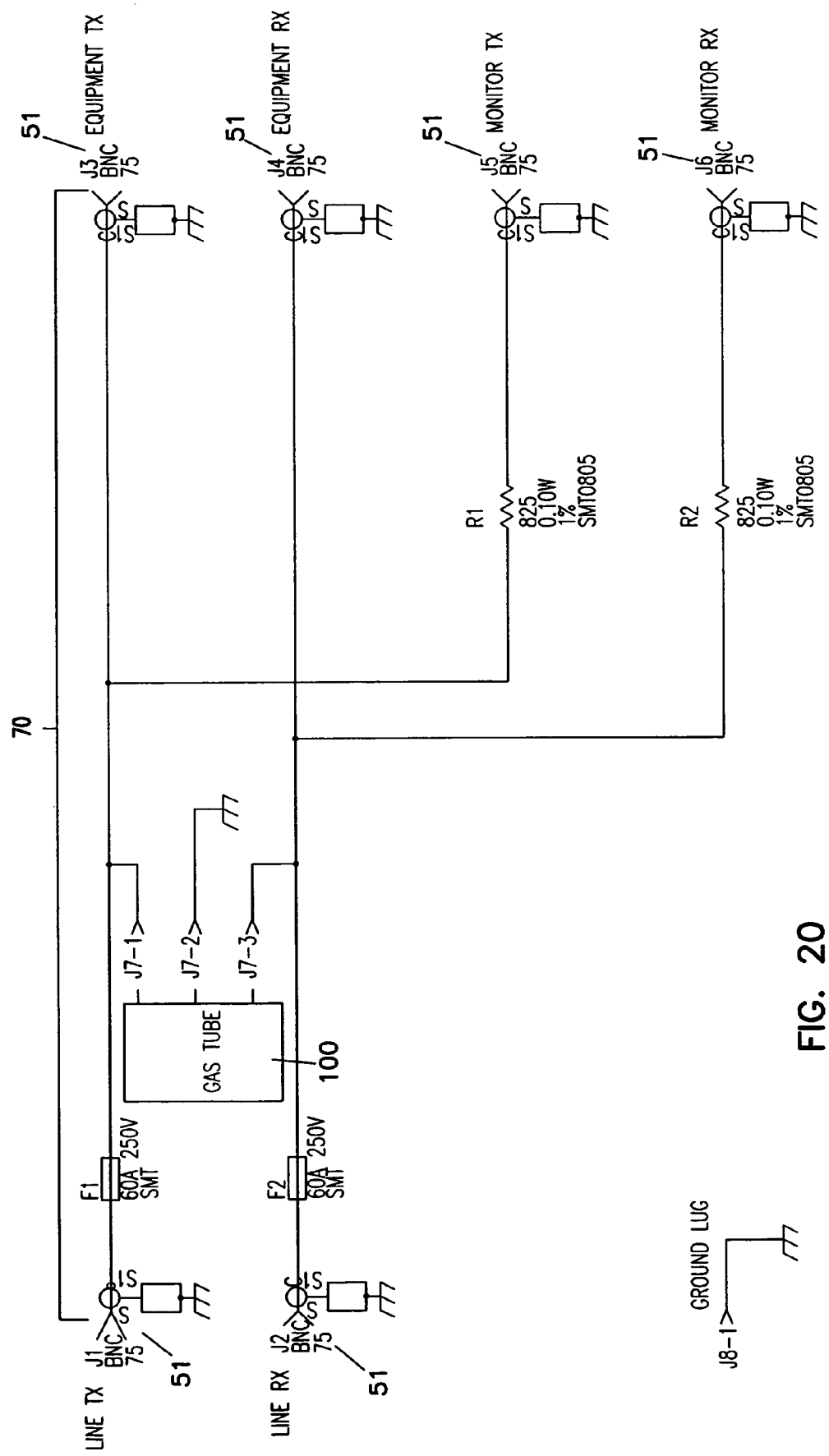
FIG. 20 is an electrical schematic view of the coaxial module of FIG. 5.
Figure 26:
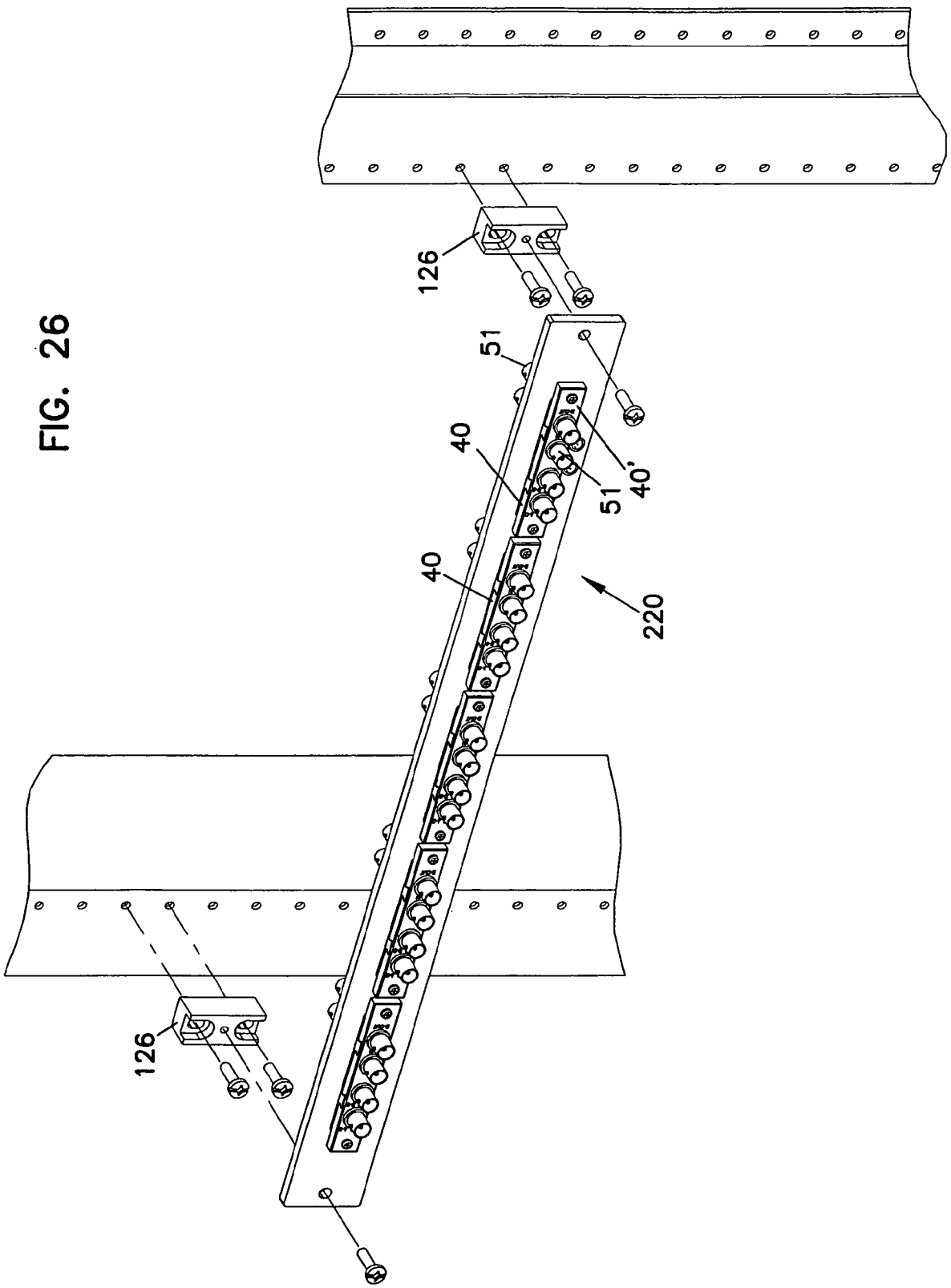
FIG. 26 is an exploded perspective view of a second alternative embodiment of a panel and a rack.
Figure 27:
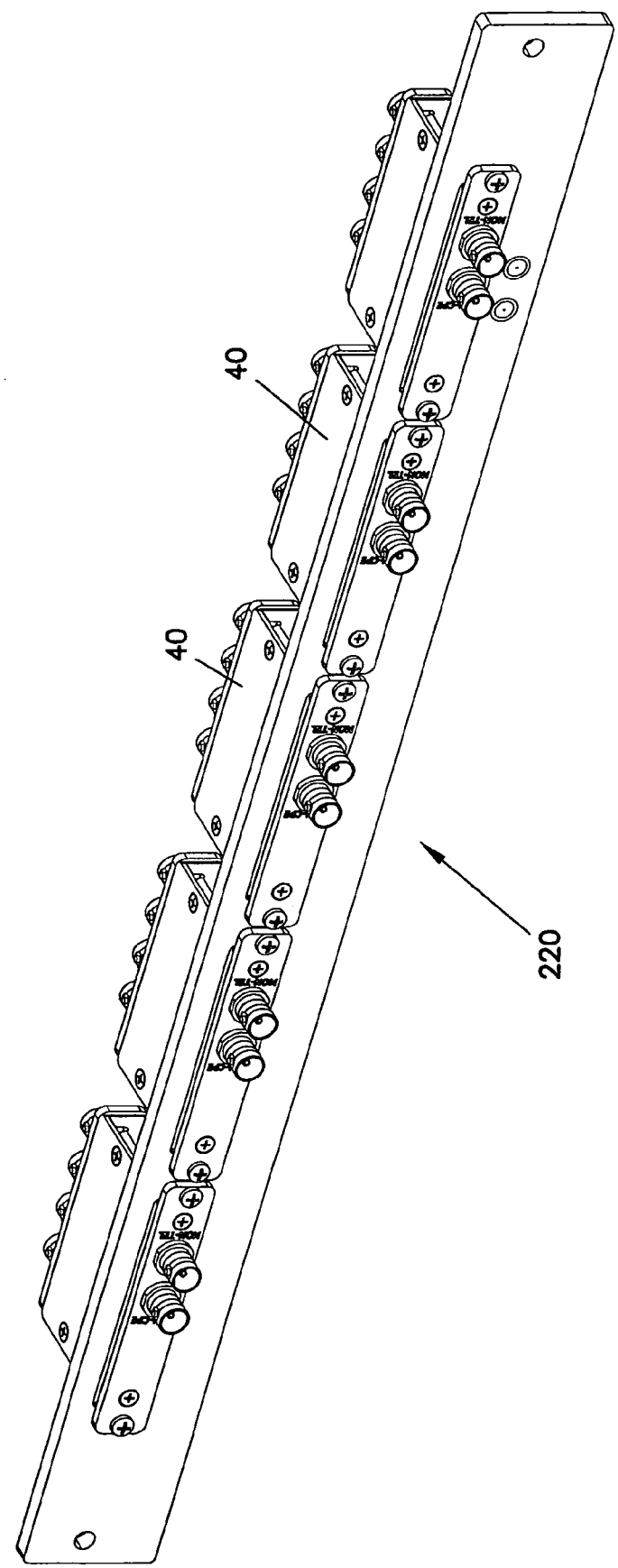
FIG. 27 is a perspective view of the panel shown in FIG. 26.

Referring now to FIGS. 2-4, panel 20 includes a frame 26 which receives a plurality of individual coaxial modules 40. Frame 26 is made from electrically conductive materials, such as sheet metal. Fasteners 42 mount each module 40 to frame 26. Frame 26 includes end brackets 28 defining fastener holes 30 for use in mounting panel 20 to vertical uprights 14, 16 with fasteners (not shown) received in fastener holes 22. Coaxial modules 40 are used to interconnect coaxial cables. Preferably, each connector module 40 couples a first set of cables from a first telecommunications component to a second set of cables leading to a second telecommunications equipment. FIG. 10 illustrates the electrical schematic for module 40 coupling equipment to a telecommunications line. Alternatively, the present cable management system could be used in a cross-connect environment in which typically two coaxial modules are used with intermediary patch cables to selectively connect cables leading to telecommunications equipment. Panel 20 includes threaded studs 32 for attaching to a grounding lug and wire to ground panel 20.

The coaxial modules 40 include a front 50 and a back 52. The front 50 and the back 52 along with first sides 54, 56 and second sides 58, 60 define a housing 62. Disposed along front 50 and rear 52 are cable connectors 51, such as BNC, F, or 1.6/5.6 connectors for connecting to mating connectors on coaxial cables. BNC connectors are shown. Front 50 is spaced from back 52 providing the module with a depth for including an electrical circuit 70 electrically connecting the connectors 51. Connectors 51 include a center conductor pin 53, and two ground shield pins 55 to connect to circuitry 70.

Figure 8:
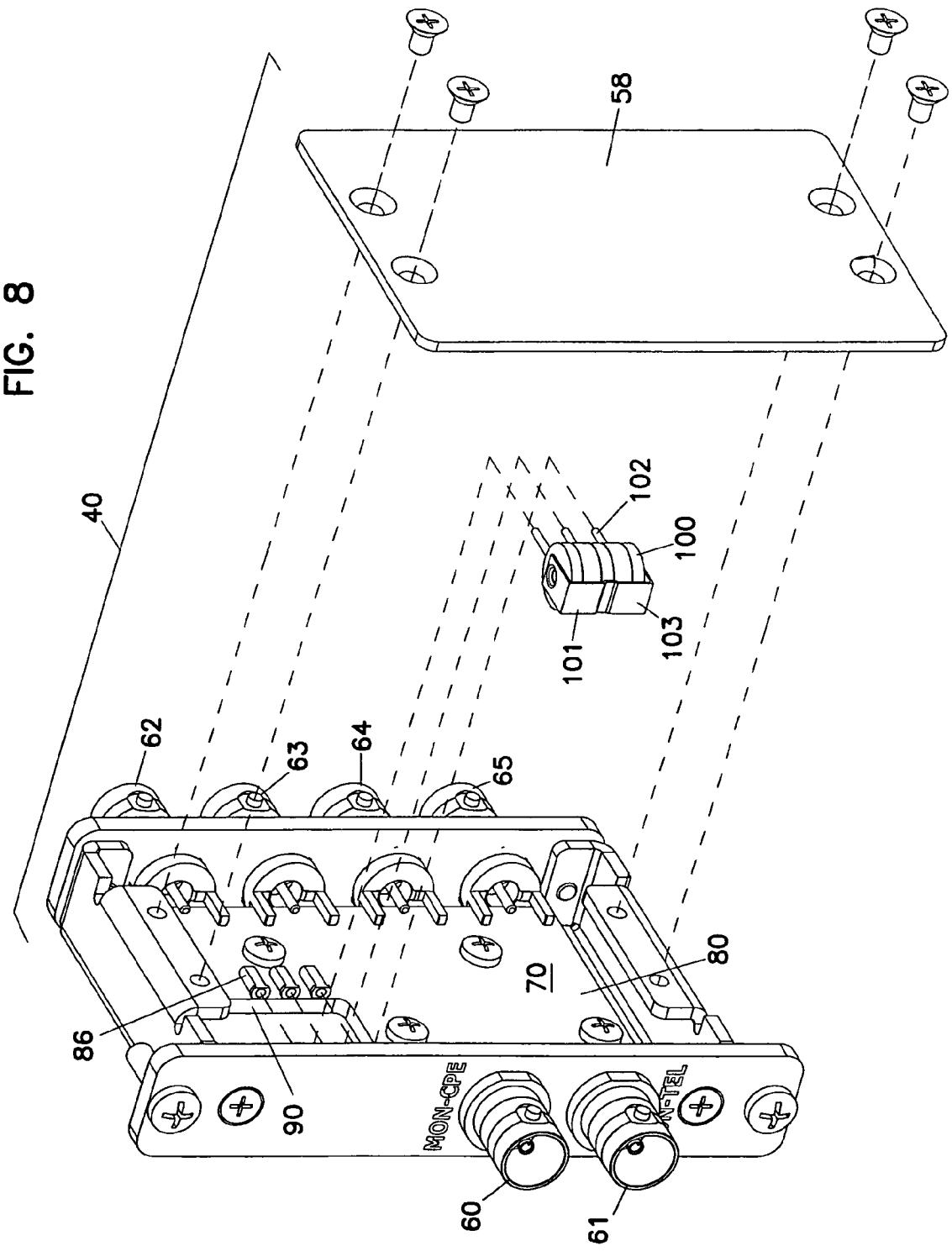
FIG. 8 is an exploded perspective view of the coaxial module of FIG. 5.
Figure 11:
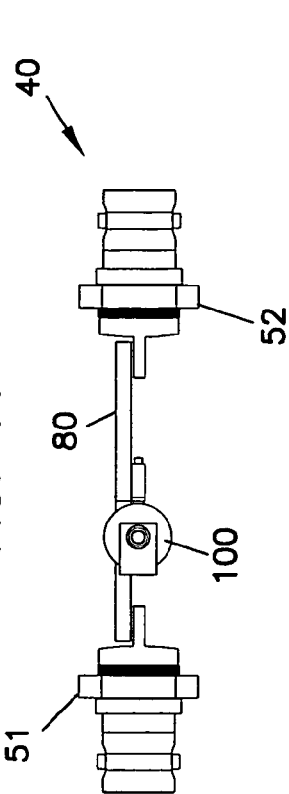
FIG. 11 is a top view of the coaxial module of FIG. 10.

In the preferred embodiment, module 40 is a dual monitor module with two front connectors 51, defining two monitor signal connectors 60, 61, and four rear connectors 51, defining four main signal connectors 62, 63, 64, 65. Circuit 70 preferably includes a circuit board 80 containing the circuitry for linking the various connectors 51. As shown in FIGS. 7-9, circuit board 80 includes a cutout 90. A surge protector device 100 resides in cutout 90. Surge protector device 100 includes a body 101 with pins 102 which mount to sockets 86 on circuit board 80 along an edge 82 of circuit board 80.

Housing 62 is made from an electrically conductive material, such as metal. In the illustrated embodiment, housing 62 is made from sheet metal components. Alternatively, housing 62 can be made from die-cast materials, or other manufacturing processes. Front 50 and back 52 are panel pieces mounted perpendicularly relative to circuit board 80. A main housing portion 57 with a main panel 66 and two ends 68 are mounted to front and back 50, 52, such as with fasteners 69.

Side 58 of housing 62 is preferably a removable cover separable from a remainder of housing 62 by removing fasteners 44. By removing cover 58, surge protector device 100 can be removed and replaced, if desired.

The following dimensions are provided with respect to the embodiment illustrated in FIGS. 1-14:
A. 19 inches
B. 4 inches
C. 3.7 inches
D. 0.63 inches
E. 3.224 inches
F. 3.04 inches
G. 0.625 inches The embodiment illustrated in FIGS. 1-14 of panel 20 shows twenty-four modules 40 disposed in a 19-inch panel, 4 inches high.

Referring now to FIGS. 15-19, alternative positions are shown for surge protector device 100. In FIGS. 15-17, surge protector device 100 is shown mounted with its pins 102 extending perpendicularly to pins 53, 55 of connectors 51. Surge protector device 100 is positioned in cutout 90 in a similar manner as for the embodiment shown in FIGS. 5-14. With respect to FIGS. 18 and 19, an alternative surge protector device 100' is shown with its pins 102 mounted through circuit board 80. As shown by comparing surge protector device 100 and surge protector device 100' in FIG. 19, a wider profile for module 40 is defined by the positioning of pins 102 through circuit board 80. For this reason, the cutout positioning of surge protector device 100 as shown in FIGS. 10 and 16 is preferred. The position of device 100 in FIG. 10 is preferred so that circuit tracings are more efficiently directed to rear connectors 51.

With the location of the surge protector device 100 in module 40, a user can remove device 100 if it is necessary to replace it, by only removing cover 58. Also, the width profile of module 40 resulting from placing device 100 in the cutout 90 with an edge mount to board 80 allows for the densities noted herein for the 19 or 23 inch racks. Other pin mounted surge protector devices can be used, as well as non-pin mounted devices to achieve the densities in accordance with the invention.

FIG. 21-25 show an alternative embodiment of a panel 120 including ten modules 40 in a 23-inch panel. FIG. 21 also shows modified modules 40' with four connectors 51 on the front and two connectors on the rear. In both versions, the monitor connectors are provided on the front. Either version can be provided for the modules as desired. FIG. 21 also shows insulator pads 126 to insulate panel 120 from rack 12. Pads 126 mount with fasteners 128 to rack 12.

The modules 40 in panel 120 are oriented horizontally, rather than vertically in panel 20. The dimensions of panel 120 are as follows:
H. 23 inches
I. 2 inches FIGS. 26-30 show a further alternative embodiment of a panel 220 including five modules 40. In a similar manner as panel 120, modules 40 are oriented horizontally in panel 220.

The dimensions for panel 220 are as follows:
H. 23 inches
J. 1.75 inches

Figure 31:
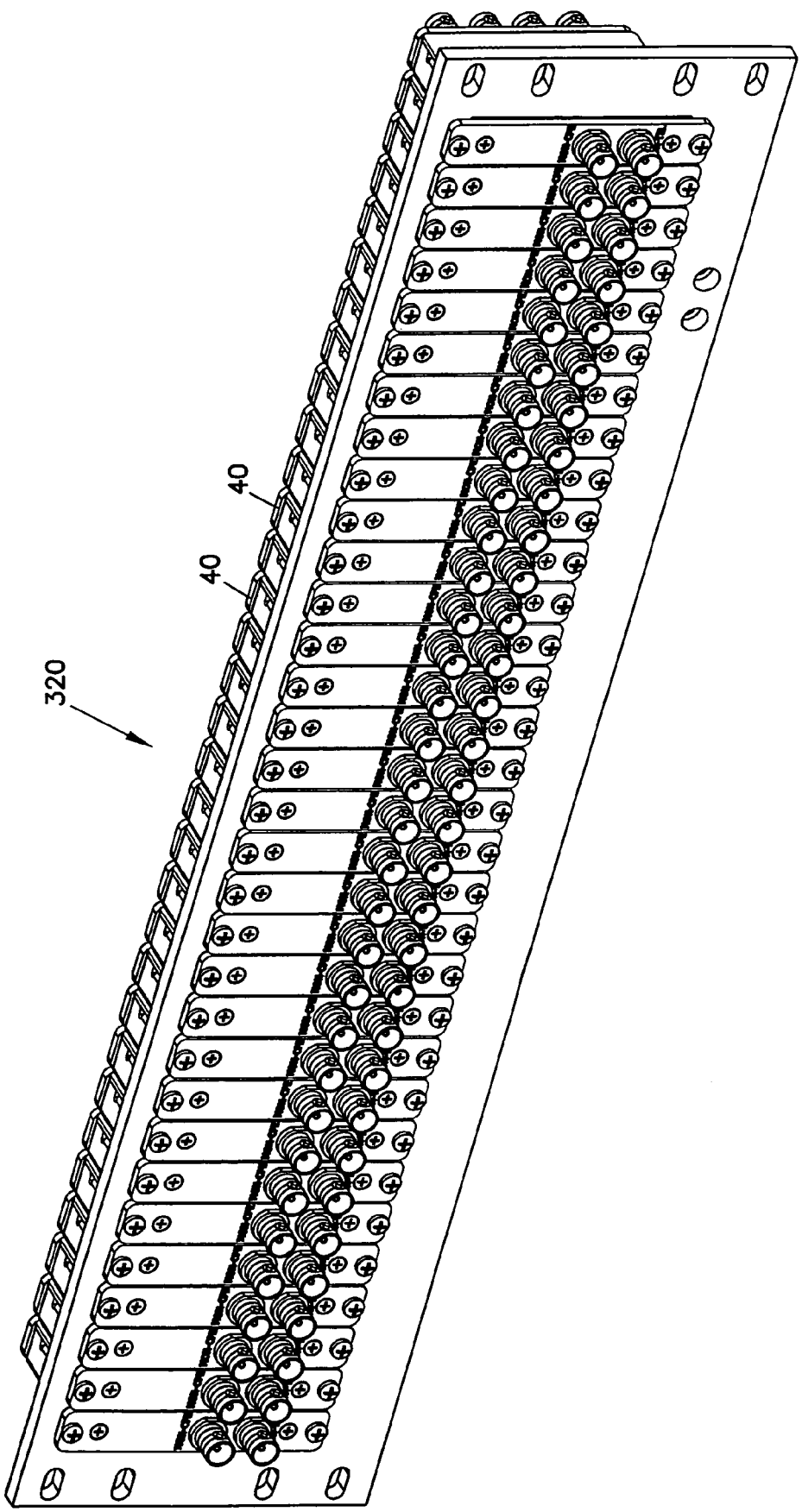
FIG. 31 is a perspective view of the third alternative embodiment of a panel.
Figure 33:
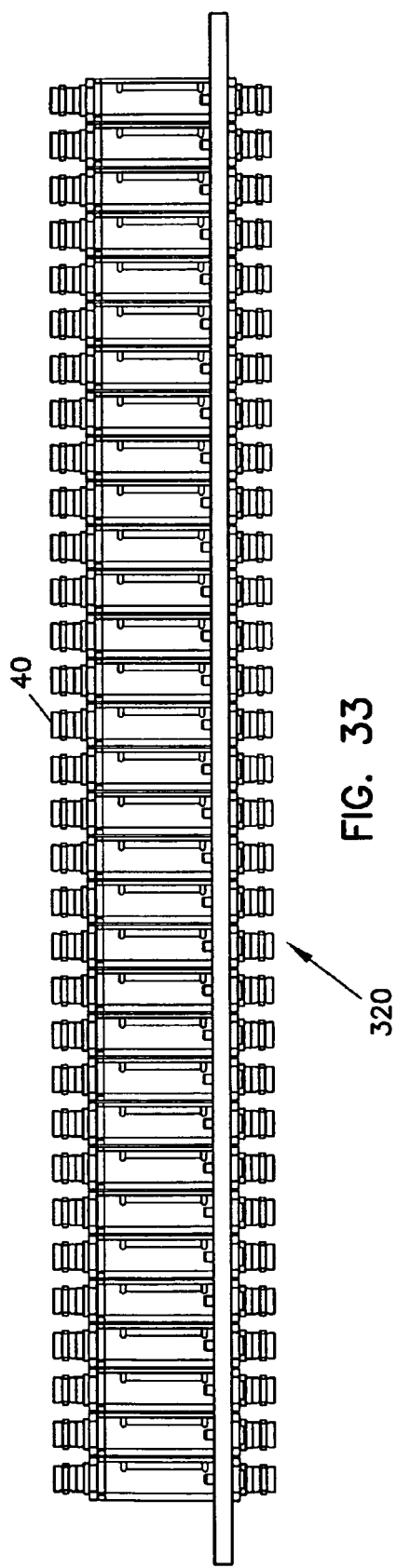
FIG. 33 is a top view of the panel of FIG. 32.
Figure 32:
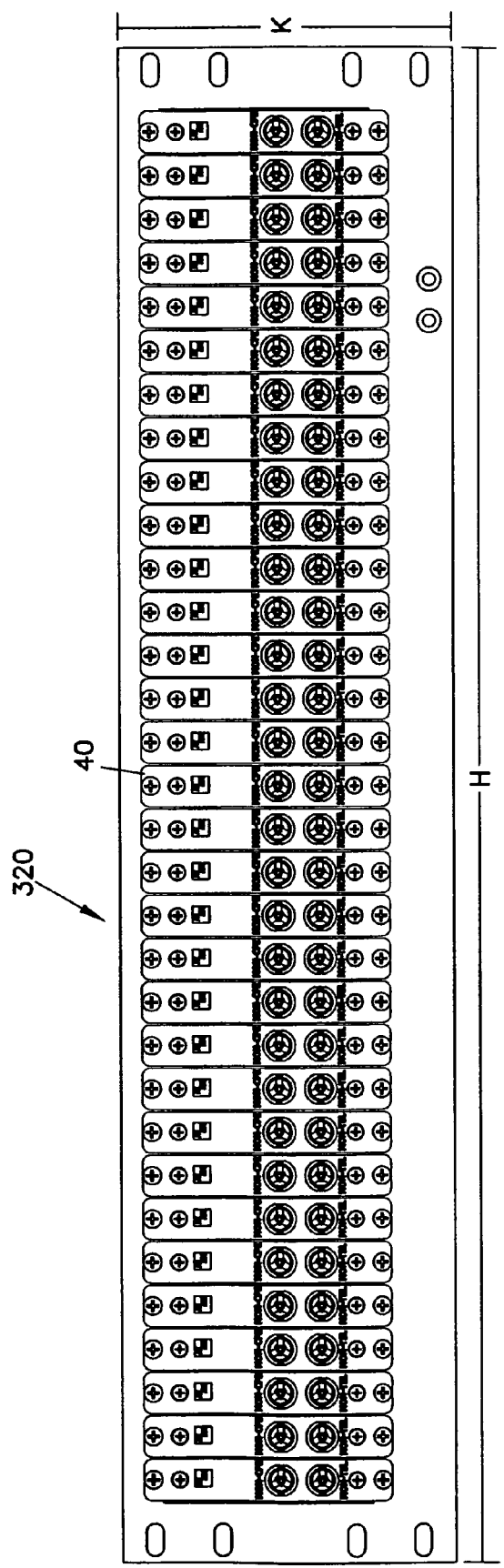
FIG. 32 is a front view of the panel of FIG. 31.

Referring now to FIGS. 31-33, thirty-two modules 40 are provided in a panel 320. Modules 40 are oriented vertically, as in panel 20. The dimensions for panel 320 are as follows:
H. 23 inches
K. 5 inches An example of a surge protector device 100 in one preferred embodiment is a gas tube or gas discharge tube surge protection device by Littelfuse®. of Des Plaines, Ill., part no. 1021 medium duty arrester series, 260 volts. During a surge in power, the device connects the center conductor to ground, which connects it to housing 62, and frame 26. Device 100 includes a fail safe element 103. While the preferred surge protection device is removable, a non-removable device is also contemplated.

Since many embodiments of the invention can be made without departing from the spirit and scope of the invention, the invention resides in the claims hereinafter appended.

What is claimed is:
1. A coaxial module comprising:
a housing having a front and a back of electrically conductive material;
a first plurality of coaxial connectors mounted at the back of the housing with outer shields of the connectors electrically coupled to the back of the housing;
a second plurality of coaxial connectors mounted at the front of the housing with outer shields of the connectors electrically coupled to the front of the housing;
circuitry electrically connecting the first and second plurality of coaxial connectors, the circuitry including a circuit board defining a cutout; and a surge protector device including a body at least partially positioned in the cutout of the circuit board, wherein the surge protector device is an edge mount device mounted to an edge of the circuit board along the cutout.

2. The coaxial module of claim 1, wherein the surge protector device is removable.

3. The coaxial module of claim 1, wherein the surge protector device is a three-pin device.

4. The coaxial module of claim 1, wherein the circuitry includes two main signal lines through the module, wherein the circuitry includes a monitoring signal line for each of the main signal lines, wherein the first and second plurality of coaxial connectors are connected to one of the main and monitoring signal lines.

5. The coaxial module of claim 1, wherein the surge protector device includes a pin and wherein the first plurality of coaxial connectors and the second plurality of coaxial connectors include pins, the surge protector device mounted such that the pin of the surge protector is positioned parallel to the pins of the connectors.

6. The coaxial module of claim 1, wherein the surge protector device includes a pin and wherein the first plurality of coaxial connectors and the second plurality of coaxial connectors include pins, the surge protector device mounted such that the pin of the surge protector is positioned perpendicular to the pins of the connectors.

7. The coaxial module of claim 1, wherein the surge protector device includes pins which mount to sockets on the circuit board along the edge of the circuit board.

8. The coaxial module of claim 7, wherein the circuit board includes three sockets, and the pins of the surge protector engage the sockets.

* * * * *